United States Patent [19]

Hammer

[11] Patent Number: 5,234,183
[45] Date of Patent: Aug. 10, 1993

[54] PLASMA PLUME MHD POWER GENERATOR AND METHOD

[75] Inventor: James H. Hammer, Livermore, Calif.

[73] Assignee: The United States of America as represented by the Department of Energy, Washington, D.C.

[21] Appl. No.: 869,929

[22] Filed: Apr. 17, 1992

[51] Int. Cl.$^5$ ................................................ B64G 1/00
[52] U.S. Cl. ................................ 244/158 R; 244/1 R
[58] Field of Search .......................... 244/158 R, 1 R; 322/2 R; 315/111.41

[56] References Cited

U.S. PATENT DOCUMENTS

| | | | |
|---|---|---|---|
| 4,033,524 | 7/1977 | Brice et al. | 244/158 |
| 4,368,415 | 1/1983 | Henderson et al. | 244/158 R X |
| 4,712,155 | 12/1987 | Eastland et al. | 244/158 R X |

OTHER PUBLICATIONS

J. H. Hammer, "Plasma Plumes for Tapping the Electromotive Force of the Solar Wind", UCRL-ID-106990, Apr. 1991.
S. D. Drell et al., "Drag and Propulsion of Large Satellites in the Ionosphere . . . ", Journal of Geophy. Res., vol. 70, No. 13, p. 3131, Jul. 1965.
M. J. Gerver et al., in "Current Collection from Space Plasmas", NASA Con. Pub. 3089 (Sci. & Tech. Info. Div.), 1990, pp. 150–189.
P. M. Banks et al., "Electrical Behavior Of A Shuttle Electrodynamic Tether System (Sets)", Planet. Space Sci., vol. 29, pp. 139–147.
A. Valenzuela et al., "The AMPTE Artificial Comet Experiments", Nature, vol. 320, 24 Apr. 1986, pp. 700–703.
L. K. Rudolph et al., "The MPD Thruster Development Program in Electronic Propulsion and its Applications . . . ", vol. 79, 1981, pp. 518–526.
V. G. Belan, "Experimental Study of Quasistationary Plasma Accelerator . . . ", Sov. J. Plasma Phys., 16(2), Feb. 1990, pp. 96–101.
D. Y. Cheng et al., "Deflagration Plasma Thruster", in Orbit-Raising and Maneuvering Propulsion . . . , vol. 89, Prog. in Astro & Aero, 1984, p. 371.
J. H. Gilland et al., "Multimegawatt Electric Propulsion System Design Considerations", AIAA 90–2552, Jul. 18–20, 1990, pp. 1–14.

*Primary Examiner*—Sherman Basinger
*Assistant Examiner*—Christopher P. Ellis
*Attorney, Agent, or Firm*—Henry P. Sartorio; Roger S. Gaither; William R. Moser

[57] ABSTRACT

Highly-conducting plasma plumes are ejected across the interplanetary magnetic field from a situs that is moving relative to the solar wind, such as a spacecraft or an astral body, such as the moon, having no magnetosphere that excludes the solar wind. Discrete plasma plumes are generated by plasma guns at the situs extending in opposite directions to one another and at an angle, preferably orthogonal, to the magnetic field direction of the solar wind plasma. The opposed plumes are separately electrically connected to their source by a low impedance connection. The relative movement between the plasma plumes and the solar wind plasma creates a voltage drop across the plumes which is tapped by placing the desired electrical load between the electrical connections of the plumes to their sources. A portion of the energy produced may be used in generating the plasma plumes for sustained operation.

25 Claims, 3 Drawing Sheets

PLASMA PLUME MHD POWER GENERATOR AND METHOD

The U.S. Government has rights in this invention pursuant to Contract No. W-7405-ENG-48 between the U.S. Department of Energy and the University of California for the operation of Lawrence Livermore National Laboratory.

BACKGROUND OF THE INVENTION

1. Field of the Invention

The present invention relates to the generation of electrical power in space. In particular it concerns generating electricity from the electromotive power of the solar wind by utilizing plasma plumes ejected across the interplanetary magnetic field of the solar wind.

2. Description of Related Art

It has been proposed to generate electrical power in space within the magnetosphere of the earth by trailing long wires or "tethers" from spacecraft, such as the shuttle or space station, converting some of the energy of relative motion between the spacecraft and the magnetospheric plasma into electrical power. This procedure would be impractical except in the presence of a relatively strong flux such as the magnetosphere of the earth because of the extreme length of the tethers that would be required. Moreover, generation of electrical power in this fashion comes at the expense of kinetic energy that would be lost by the spacecraft.

It has been further proposed for the just described procedure to locate small plasma guns at electrodes at the trailing ends of the tethers to improve current collection by surrounding the electrode to, in essence, increase its effective size.

The solar wind, constituted of ionized molecules escaping and moving outwardly of the sun, pervades the solar system, except for regions close to a planet having a magnetosphere that excludes it. It is known that the this plasma has an accompanying, or "frozen in," magnetic field.

In experiments in space lithium and barium plasma clouds have been artificially produced by ejecting into space finely divided lithium and barium compounds which ionize, because they are exposed to the solar wind. Using magnetic sensors induced electrical currents were detected, along with the exclusion of the interplanetary magnetic field from the cloud interior.

SUMMARY OF THE INVENTION

This invention provides a practical method and apparatus for extracting electrical power from the relative motion of a spacecraft or other body in space with the solar wind plasma. In accordance with this invention to create electrical power highly-conducting plasma plumes are ejected across the interplanetary magnetic field from a situs that is moving relative to the solar wind, such as a spacecraft or an astral body, such as the moon, having no magnetosphere that excludes the solar wind. Discrete plasma plumes are generated at the situs extending in opposite directions to one another and at an angle, preferably orthogonal, to the magnetic field direction of the solar wind plasma. The opposed plumes are separately electrically connected to their source by a low impedance connection. The relative movement between the plasma plumes and the solar wind plasma creates a voltage drop across the plumes which can be tapped by placing the desired electrical load between the electrical connections of the plumes to their sources. Advantageously, a portion of the energy produced may be used in generating the plasma plumes for sustained operation.

In the vacuum and weightless conditions of space plumes generated by plasma guns will extend over large distances and, with sufficient mass flow, they may extend thousands of kilometers to generate in excess of 10 megawatts. With a situs on an astral body such as the moon, ejection must be at a rate to overcome the gravity of that body but mass source is essentially unlimited.

The power density of the solar wind is very low (around $10^{-3} W/m^2$), but while fluctuating some degree it characteristically flows at speeds of around 1000 kilometers per second. Thus, preliminary MHD analysis indicates that extractable power is proportional to the mass ejection rate of the plumes, with net power production (over the power required to generate the plumes) possible when the plume velocity across the magnetic field is sufficiently less that the solar wind Alfven velocity (around 80 km/sec.). Additional background and an elaboration on the HMD analysis is available in the publication "Plasma Plumes for Tapping the Electromotive Force of the Solar Wind" of James H. Hammer, incorporated herein by reference. This publication is available to the public from the National Technical Information Service, U.S. Department of Commerce, 5285 Port Royal Road, Springfield, Va 22161.

Plasma guns are the preferred device for generating the plasma plumes. However, self-ionizing plumes may be established by projecting streams of un-ionized gas which will quickly become ionized by solar radiation. In this embodiment, a conductor extending from the source along the close in portion of the plume may be used to establish at least an initial electrical connection therebetween.

The plume projecting devices are desirably composed of electrically conductive material and serve as the electrical connection with the plasma plume they generate. For maximum power production for spacecraft use, the plumes are arrayed in opposition to one another, desirably coaxially, to eject plasma in opposite directions, with no net thrust on the craft. However, for a space craft situs they may be arranged for net thrust for propulsion as desired. This may be accomplished by arranging opposed projecting devices to project outwardly at an angle between them of less than a 180 angle to leave a net thrust in the direction opposite the median between their thrust directions. Alternatively, the projecting devices may be unbalanced to one side, as by operating the devices for one plume at a higher rate or by providing an unbalanced number of projecting devices for the plumes.

For use in an astral body locus such as the moon, the plasma guns or other projecting devices may be directly opposed to project the plume tangentially outwardly of the surface. For bodies with stronger gravity it may be desirable to extend the plumes more directly outward of the body to more easily reach the escape velocity and overcome the gravity of the body. In either case the plume should be accelerated to a speed at least equal to the escape velocity of the body. If the plume projecting devices are located far enough apart, they may both be aimed close to or at the vertical. If close together, they are desirably arranged to point outward at an angle to each other so that the plumes they generate remain discrete and do not intermingle.

DETAILED DESCRIPTION OF THE INVENTION

Figure 1:
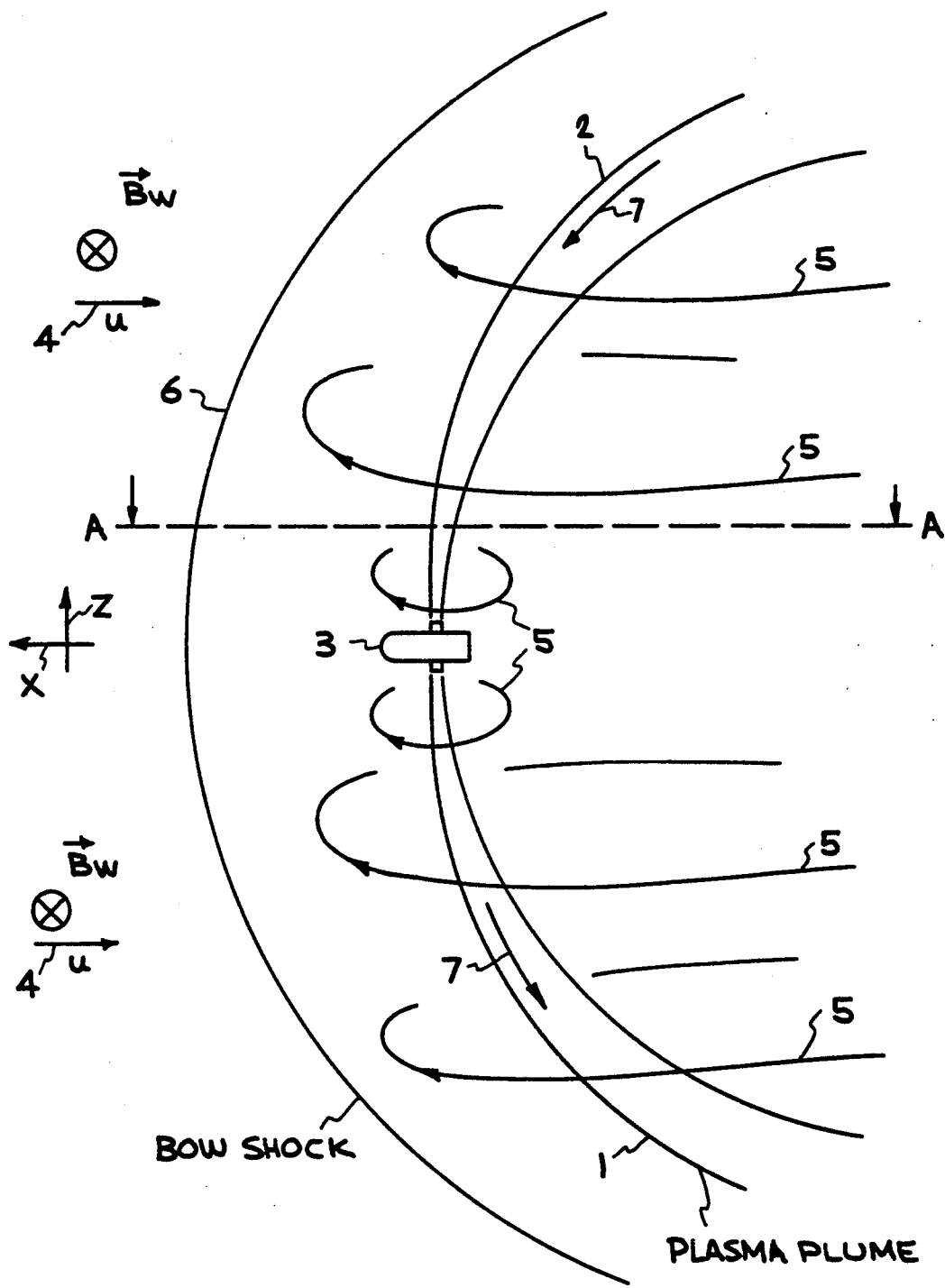
FIG. 1 is a schematic representation of the interaction of spacecraft generated plasma plumes with the solar wind, shown on an x-z axis along which the plumes extend.
Figure 2:
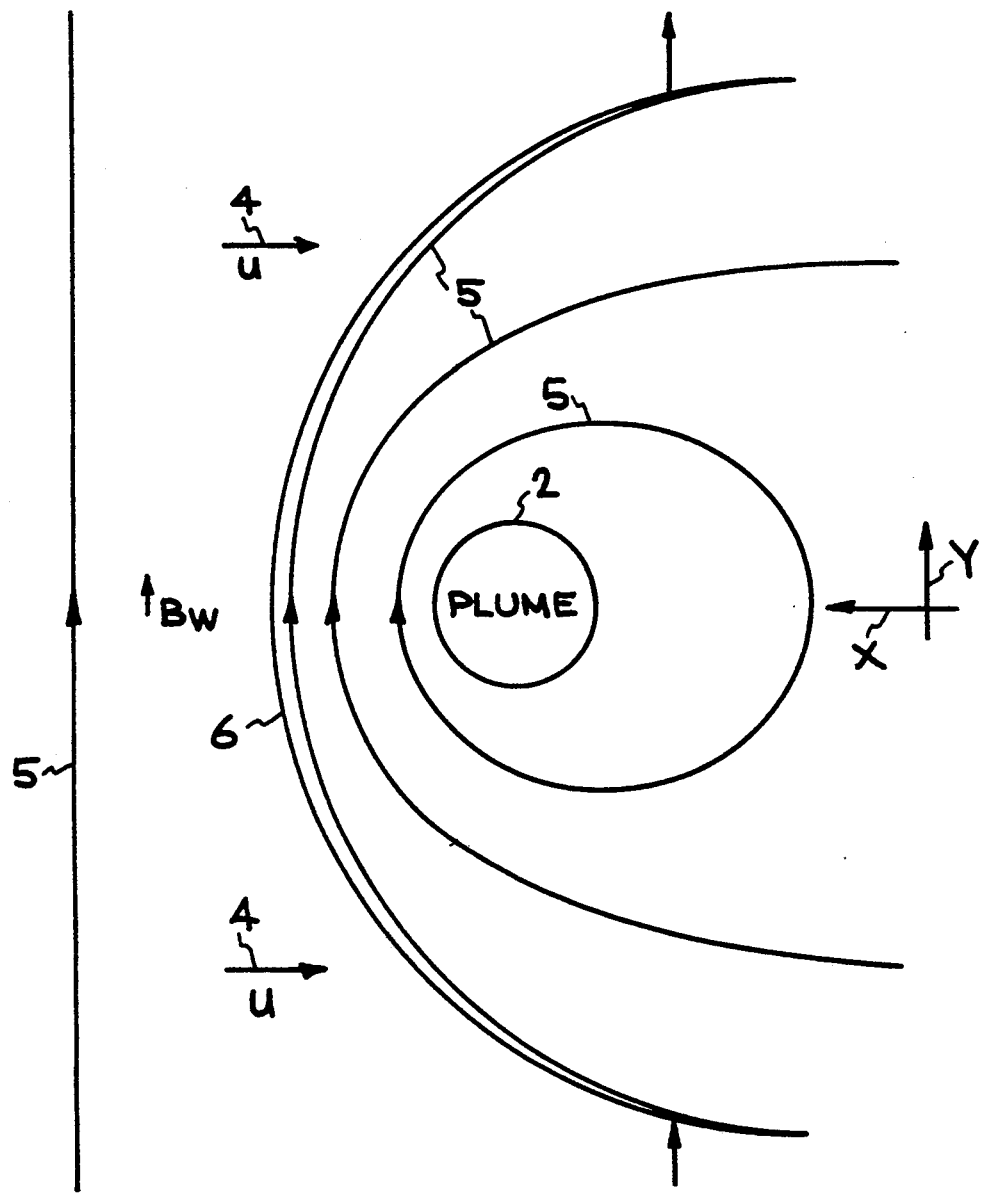
FIG. 2 is a cross-section on the x-y axis of the plume taken along lines A—A of FIG. 1.

The general concept of this invention can be appreciated by reference to FIGS. 1 and 2 of the drawings which depict plasma plumes 1 and 2 each emanating from a source at a common locus, which in this case is spaceship 3 traveling in space, and extending in generally opposite directions from that locus and thus generally along the same longitudinal axis. This longitudinal axis is orthogonal to the direction of the solar wind, depicted by arrows 4, and to the direction of the magnetic field of the solar wind, shown by lines of force 5 bearing directional arrows. The oncoming solar magnetic flux compresses as it reaches plumes 1 and 2 which tend to exclude it, thus forming a bow shock 6 much as the earth bow shock where the solar wind meets the earth's magnetosphere (essentially a magnetic shock wave). As the plasma plumes extend farther out they gradually attenuate and are heeled over by the solar wind momentum, forming a curved configuration such as depicted in FIG. 1.

The relative movement of the solar flux and plasma plumes 1 and 2 creates an electromotive force along the plumes, as lines of force 5 move across the plumes and are cut by them. Plasma plumes 1 and 2 are electrically connected at their sources at locus 3, as will be described. Thus, current will flow with the directionality shown by arrows 7, along plume 2 to its source at locus 3, then to plume 1 through its electrical connection therewith and from their outwardly along plume 1. Useful power is obtained by interposing the desired electric load in the electrical connection between the plasma plumes.

The voltage drop that may be expected across the plume is typically a few thousandths of volt per meter. Thus, plumes of 1000 km length overall across the solar wind flux would generate on the order of a few thousand volts potential. Plumes of this general magnitude and longer are desirable and may be created developing sufficient mass flow and velocity by proper choice of plasma guns and operating conditions. Desirably, the mass flow rate times the velocity for the plumes is substantially above $1 \times 10^5$ gm cm/sec$^2$ and the energy production substantially above 100 KW to a megawatt, which may be considered near the threshold for practical operation. At too low of mass and energy input, the plumes formed may be too weak to sustain any practical operation.

Figure 4:
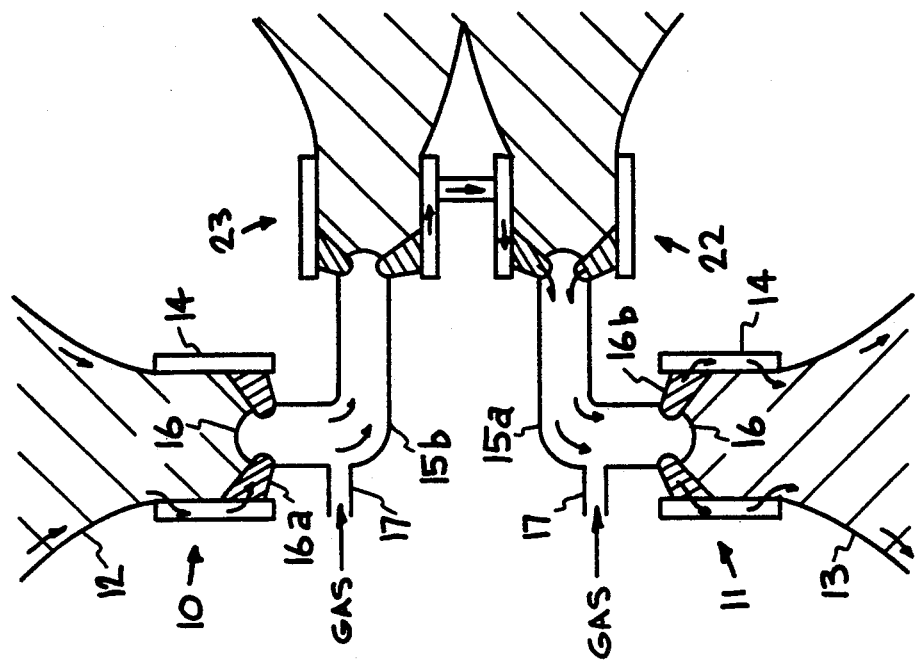
FIG. 4 is a diagrammatic cross-sectional view of apparatus for plume generation and power collection similar to that of FIG. 3 coupled with thrust producing guns and including circuitry for utilizing the collected power in excess of that required for sustaining operation of the coaxial plasma guns to electrically power the thrust producing guns.
Figure 3:
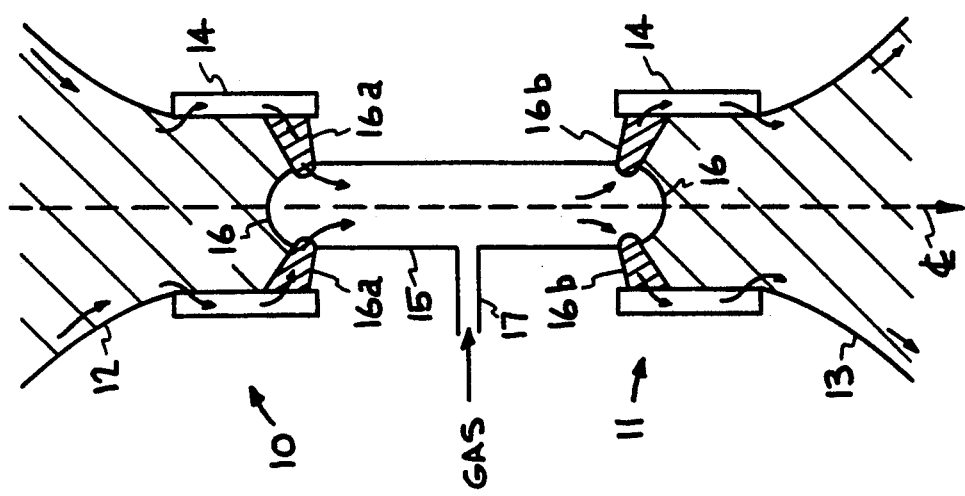
FIG. 3 is a diagrammatic cross-sectional view of apparatus for plume generation and power collection in accordance with this invention with coaxial, opposed plasma guns in a self-sustaining mode.

Apparatus particularly suitable in spacecraft applications for creating the plasma plumes and for tapping the electrical power generated in the plumes is shown in FIGS. 3 and 4. Referring first to FIG. 3, MPD electric arc plasma guns 10 and 11 are arrayed coaxially and opposed so that they eject plasma in opposite directions. The guns are composed of conductive material and by this means electrical contact is maintained with the plasma plumes 12 and 13, respectively, which are continuously emitted therefrom during operation. Throats 14 of each gun serve both as the other electrode for generating a plasma creating arc. Metallic and electrically conductive chamber 15 serves as a conduit for supply of gas to each gun and, at its terminal ends 16 in the throat of each respective gun, as the inner electrode for arc creation. Gas for ionization and projection is supplied to chamber 15 through line 17 from a gas source (not shown).

As designated by the arrows, current from the plume 12 is conducted by throat 14 of gun 10 to an arc gap 16a. The current arcs across arc gap 16a to chamber 15 which conducts it to its other terminal end 16 in gun 11 where it arcs across arc gap 16b to throat 14 of gun 11 which conducts it to plume 13 to complete the circuit. Arc gaps 16a and 16b serve as the line load, utilizing the power generated by the plumes, and the arcs generated thereby continuously generate further plasma to maintain the plumes. Thus in this arrangement the plasma guns are self-sustaining.

In the embodiment of FIG. 4, self-sustaining coaxial guns 10 and 11 are provided and arranged as described in FIG. 3, except that instead of a single gas supply conduit, each gun is provided with a separate gas supply chamber 15a and 15b, respectively, which are electrically isolated from each other except through thrust-producing plasma guns 22 and 23 as will be described.

Thrust producing plasma guns 22 and 23 are oriented to thrust in the direction opposite of the desired travel direction of the spacecraft. They are construction and operate the same as described for guns 10 and 11 except that gas chamber 15a from gun 11 serves as the gas supply and inner electrode for gun 10 and gas chamber 15b from gun 10 serves as the gas supply and inner electrode for gun 23.

In the operation of this embodiment, current is conduct from plume 12 across plasma gun 10 to chamber 15a as described for FIG. 3. The current flows through chamber 15b to guns to 23 and 22 which are electrically connected through bus bar 24. The current travels through gun 23 as described for guns 10 and 11, thence through bus bar 24 to gun 22 and then through gun 22 in the same fashion to chamber 15a. The current then travels from chamber 15a to and through gun 11 to plume 13, all as previously described, to complete the circuit. As thus arranged, thrust producing guns serve as electrical load for utilization of the power generated by the plumes in excess of that required to operate self-sustaining guns 10 and 11.

The preferred type of plasma gun, as shown, is the applied-field type MPD arc plasma gun and particularly the design described in the paper "Multimegawatt Electric Propulsion System Design Considerations", J. H. Gilland et al. AIAA No 90-2552, given at the Twenty First International Electrical Propulsion Conference, Jul. 18-20, 1990 at Orlando, Fla. and available from the American Institute of Aeronautics and Astronautics, 370 L 'Enfant Promenade, S. W., Washington, D.C. 20024. This and other MPD arc guns were developed for use as thrusters and provide a relatively high specific impulse. They are quite suitable for use in this invention as they are capable of a high mass flow rate and impart adequately high velocity to the ions inherently formed to produce the desired far-reaching plumes in space. This indicated plasma gun, shown in FIG. 2 of the paper, is used without the boron nitride insulating plate shown, in order to avoid possible shorting by stray plasma. Other insulating support means distant from the mouth of the gun is employed instead.

In the embodiments of FIGS. 3 and 4 as well as other embodiments, it is desirable that the plasma guns and associated apparatus in their vicinity be electrically conductive and that all insulators necessary for electrical isolation of the plasma guns and elements in the conductive path be at a substantial distance away. This is because of the possibility such insulators, in the presence of stray plasma may become conductive and short out the power flow.

In the preferred embodiment for space application 9 coaxial units as shown in FIG. 3 are arranged side-by-side with the common axis of their plasma guns parallel to each other. They are operated electrically in parallel. So arranged to project plumes close together in parallel, the individual plumes to each side will merge together to form a single plume. Hydrogen is employed as the ionizing gas and is supplied in equal distribution to all of the plasma guns of these units (and ejected) at a rate for the entire array of 10 grams per second to establish a plume velocity to each side of 60 km/sec. The mass flow rate times velocity is thus $6 \times 10^7$ gm cm/sec$^2$. The power production from the plume is estimated at 100 MW at the expected plasma gun efficiency of 40%. To tap the power generated for loads in addition to the plasma guns, conventional electric connections may be made to interpose the desired load or loads. Alternatively, to concentrate the current and even out the current flow, the units can be connected in "parallel/series/parallel." That is, instead of electrical connections between individual coaxial units, the array of guns for each plume are electrically connected together and then their common connections electrically are connected together through the desired load.

On start up, an auxiliary electrical power source such as voltaic cells (not shown) is electrically connected across the electrodes of each of plasma guns 10 and 11 to initially establish the plumes. Feed of a gas, preferably hydrogen, is initiated into chamber 15 (chambers 15a and 15b in the case of the embodiment of FIG. 4). Once the plumes are established, the system will become self-sustaining, because of the power that they supply to the plasma guns, and the auxiliary power can be disconnected. Start up power requirements are minimized by first establishing a gas plume of un-ionized gas, using the gas injection system and gas gun, which is quickly ionized by solar radiation, and then in a few seconds energizing the guns.

As described, more than two plasma guns may be used for creation of the plasma plumes and for efficiency it may be desirable to utilize an array consisting of a multiplicity of smaller guns which better match the impedance of the plasma plumes.

Other types of plasma gun which may be selected for use in this invention include the self-field type MPD arc gun as described in the paper "The MPD Thruster Development Program", L. K. Rudolph et al., published in "Electric Propulsion and Its Applications to Space Missions," Vol. 79 of *Progress in Astronautics and Aeronautics* (*American Institute of Aeronautics and Astronautics*, 1981), pp 518–526.

In addition to MPD arc plasma guns other types of directional accelerated plasma projecting devices providing a substantial specific impulse may be employed. These include deflagration guns, such as described in the paper "Orbit-Raising and Maneuvering Propulsion:- Research Status and Needs", Vol 89 of *Progress in Astronautics and Aeronautics* (*American Institute of Aeronautics and Astronautics*, 1984) p. 371, and large diameter quasi-steady plasma guns currently under development in Russia, as described in the paper in the periodical *Soviet Journal of Plasma Physics*, 16, 96 (1990), by V. G. Belan et al. Additionally, ion thrusters may be employed.

The most appropriate choice of plasma projecting device will depend upon the situs of power generation, including weight limitations, the various requirements for the power generated (e.g. short or sustained and long term applications, impedance of the desired load, etc.) and the type of matter to be utilized for producing ions.

As another embodiment a self-ionizing plume may be established by projecting a stream of un-ionized gas from the source (e.g. under pressure through a nozzle) which will quickly become ionized by the solar radiation. To insure adequate electrical connection back to the source through the close in portion of the plume, a conductive rod or wire may be extended along the plume from the source. When steady state is reached, this additional conducting device may not be needed, thus a temporary connection could be used such as a wire placed by a small missile (similar to a wire-guided missile) or an auxiliary plasma guns which are fired in a path intersecting the unionized gas stream at start up or left on during operation, as desired.

As with any power source, efficiency is maximized by matching the impedance of the load placed in the circuit between the plumes to the impedance of the plasma plumes and the total of such impedance would desirably be between 0.1 and 10 times the plume impedance. Calculations indicate that a small plume impedance can be expected, with a typical value being around 0.02 ohms. Thus, the 0.02 ohm MPD arc plasma guns described above are reasonably matched with plume impedance.

Use of the generated power for driving the plasma guns for creating the plume and for driving propulsion units has been shown. Additionally or alternatively this power can be employed usefully in other ways, as desired, utilizing conventional electrical systems and loads. For example, the load may be some type of energy storage means such as thermal storage.

In spacecraft applications, the preferred material for ionization is a gas such as hydrogen, water vapor, lithium, ammonia, nitrogen, hydrazine, argon or helium. Astral body applications would likely utilize the minerals and materials conveniently available there and these would be utilized with plasma gun systems designed to ionize particulate solids.

For practice of this invention where the situs is an astral body, some additional constraints and possibilities will apply. It may be preferable not to project opposed plumes directly outward tangentially from the surface of the body, particularly where the pull of gravity of the body is very strong. Therefore, the plasma guns may be oriented to project upwards of the body and, at the same time, outwards of each other at least at a substantial acute angle large enough to insure no intermingling of the plumes and to obtain a sufficiently large spread across the oncoming solar flux. Also, because of the presence of gravity on a solar system body such as the moon, the plasma in the plume must be accelerated to a velocity at least as high as, and desirably substantially exceeding the escape velocity of that body, which for the moon is 2.4 km/second.

In addition to the advantage of unlimited mass for plasma creation, the solar system body situs also offers the possible convenience that the plasma guns for one plume may be spread widely on the surface of the body from the other, running the necessary electrical conduits between their locations to complete the circuit between plumes. Indeed, conceptually, they could be placed on opposite sides of the body to project directly outward of the body and thus in direct opposition to each other for maximum spread against the solar wind flux. For lunar applications, lunar material, such as dust composed of silicon, oxygen, etc., may vaporized in appropriate conventional plasma gun systems, at somewhat less efficiency than for a gas (approx. 30%) to establish plume velocities on the order of 20-30 km/sec. Many MPD arc sources similar to the above design for solar application could be used in parallel for this application.

The fully transverse orientation of the plumes relative to solar wind flux, as shown in the above example, is normally desirable for maximum power production. Other orientations are possible but desirably there is some degree of angular relationship between the longitudinal orientation of the plumes and the solar wind flux. Such a case would the described applications, e.g. lunar, where the plasma guns may be oriented to project plumes outwardly of each other at an acute or obtuse angle. Orthogonal positioning of the plumes to the solar wind may also be desirable but the angular relationship may be different and is subject to optimization, depending on the variables of the specific application.

I claim:

1. A method of generating power at a situs exposed to the solar wind which comprises creating at separate sources at the situs discrete plasma plumes extending in opposed directions, providing electrical communication between the plumes at their source and interposing a desired electrical load in the said electrical communication between the plumes.

2. A method as in claim 1 and wherein said plumes are projected in directions that cross the magnetic field of the solar wind.

3. A method as in claim 2 and wherein the means for creating discrete plasma plumes comprises devices which create, accelerate and directionally project plasma.

4. A method as in claim 3 and wherein said devices are electrically conductive to provide electrical contact with the plumes generated thereby.

5. A method as in claim 2 and wherein said devices are plasma guns.

6. A method as in claim 5 and wherein a gas is introduced into the plasma guns to create the plasma.

7. A method as in claim 1 and wherein said plumes extend in substantially opposite directions.

8. A method as in claim 1 and wherein said plumes are opposed generally at an obtuse angle from each other that is substantially less than 180 degrees.

9. A method as in claim 1 and wherein said plumes are opposed generally at an acute angle from each other.

10. A method as in claim 1 wherein said situs is the surface of the moon.

11. A method as in claim 1 and wherein mass flow and kinetic energy is imparted to the plumes to produce a mass flow rate of plasma times the velocity of such flow that is substantially above $1 \times 10^5$ gm cm/sec$^2$ and the electrical energy produced by the plumes is substantially above 100 KW.

12. Apparatus for generating power in the presence of solar wind comprising:
   a. means for projecting a discrete plasma plume in a first direction,
   b. means for projecting a discrete plasma plume in a second direction angularly separated from the first direction, and
   c. means for establishing electrical connection between said first and second plasma plumes which includes electrical conductors at each plume projecting means.

13. Apparatus as in claim 12 and including electrical connectors electrically connecting said electrical conductors at each plume projecting means and thereby completing an electrical circuit therebetween.

14. Apparatus as in claim 13 and wherein said electrical connectors include a desired electrical load for utilizing power generated by the plumes.

15. Apparatus as in claim 12 and wherein the means for creating a discrete plasma plume comprise devices which create, accelerate and directionally project plasma.

16. Apparatus as in claim 15 and wherein said devices for projecting the first plume and the devices to project the second plume are angularly disposed relative to each other to project in directly opposite directions.

17. Apparatus as in claim 15 and wherein said devices for projecting the first plume are angular positioned relative to the devices for projecting the second plume to project at an obtuse angle relative to each other that is substantially less than 180 degrees.

18. Apparatus as in claim 15 and wherein said devices for projecting the first plume are angularly positioned relative to the devices for projecting the second plume to project at an acute angle relative to each other.

19. Apparatus as in claim 15 and wherein said devices are electrically conductive and comprise said means for establishing electrical connection with the respective plumes generated thereby.

20. Apparatus as in claim 15 and wherein the number of devices for producing the first plume is equal to the number of devices for producing the second plume.

21. Apparatus as in claim 20 and wherein said devices are plasma guns in pairs co-axially disposed in back-to-back relationship.

22. Apparatus as in claim 15 and wherein said devices are electrically operated plasma guns and said guns are electrically interconnected with said means for establishing electrical connections between said first and second plasma plumes appropriately to utilize the power produced by said plumes for their operation.

23. A spacecraft having power generating means as in claim 12.

24. A spacecraft as in claim 23 and wherein the space craft includes means for propelling it in space.

25. A spacecraft as in claim 24 and wherein the power source for said propelling means comprises electrical power and said means for establishing electrical connection between said first and second plasma plumes include connections to said propelling means for supplying power thereto generated by the plumes.

* * * * *